(12) United States Patent
Hou (10) Patent No.: US 12,484,237 B2
(45) Date of Patent: Nov. 25, 2025

(54) INSULATED GATE BIPOLAR TRANSISTOR

(71) Applicant: UNITED MICROELECTRONICS CORP., Hsin-Chu (TW)

(72) Inventor: Hsin-Ming Hou, Tainan (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 985 days.

(21) Appl. No.: 17/577,025

(22) Filed: Jan. 17, 2022

(65) Prior Publication Data

US 2023/0207672 A1 Jun. 29, 2023

(30) Foreign Application Priority Data

Dec. 23, 2021 (CN) .......................... 202111587888.X (51) Int. Cl.
| | | |
|---|---|---|
| *H10D 12/00* | (2025.01) | |
| *H10D 30/47* | (2025.01) | |
| *H10D 62/824* | (2025.01) | |
| *H10D 62/85* | (2025.01) | |

(52) U.S. Cl.
CPC ......... *H10D 12/461* (2025.01); *H10D 30/475* (2025.01); *H10D 62/824* (2025.01); *H10D 62/8503* (2025.01)

(58) Field of Classification Search
None
See application file for complete search history.

(56) References Cited

U.S. PATENT DOCUMENTS

| | | | |
|---|---|---|---|
| 6,674,101 B2 | 1/2004 | Yoshida | |
| 7,439,555 B2 | 10/2008 | Beach | |
| 2009/0189191 A1* | 7/2009 | Sato | H10D 88/00 |
| | | | 257/E29.1 |
| 2010/0270591 A1 | 10/2010 | Ahn | |
| 2013/0015498 A1* | 1/2013 | Briere | H10D 62/83 |
| | | | 257/191 |
| 2013/0015499 A1* | 1/2013 | Briere | H10D 30/4755 |
| | | | 257/191 |
| 2013/0092958 A1* | 4/2013 | Chen | H10D 8/70 |
| | | | 257/77 |

(Continued)

FOREIGN PATENT DOCUMENTS

| | | |
|---|---|---|
| CN | 103187436 A | 7/2013 |
| CN | 103579231 A | 2/2014 |
| CN | 110323275 A | 10/2019 |

*Primary Examiner* — Nishath Yasmeen
(74) *Attorney, Agent, or Firm* — Winston Hsu (57) ABSTRACT

An insulated gate bipolar transistor includes a P-type group III-V nitride compound layer. An N-type group III-V nitride compound layer contacts a side of the P-type group III-V nitride compound layer. An HEMT is disposed on the N-type group III-V nitride compound layer. The HEMT includes a first group III-V nitride compound layer disposed on the N-type group III-V nitride compound layer. A second group III-V nitride compound layer is disposed on the first group III-V nitride compound layer. A source is embedded within the second group III-V nitride compound layer and the first group III-V nitride compound layer, wherein the source includes an N-type group III-V nitride compound body and a metal contact. A drain contacts another side of the P-type group III-V nitride compound layer. A gate is disposed on the second group III-V nitride compound layer.

16 Claims, 5 Drawing Sheets

(56) References Cited

U.S. PATENT DOCUMENTS

2014/0264379 A1    9/2014  Kub
2015/0270355 A1    9/2015  Kuraguchi
2019/0189441 A1*   6/2019  Fujita .................... H10D 10/80

* cited by examiner

INSULATED GATE BIPOLAR TRANSISTOR

BACKGROUND OF THE INVENTION

1. Field of the Invention

The present invention relates to an insulated gate bipolar transistor (IGBT), and more particularly to an IGBT formed by a high electron mobility transistor (HEMT) and a heterojunction bipolar transistor.

2. Description of the Prior Art

IGBT is a power transistor frequently used in the industry. It combines the insulated gate structure of a metal-oxide-semiconductor field effect transistor (MOSFET) with the on state characteristic of a bipolar junction transistor (BJT). Therefore, an IGBT has advantages of high output current and high input resistance. IGBTs are characterized by high efficiency and high switching speed, and are designed to improve the efficiency of BJTs. In recent years, with the demand of efficiency of semiconductor devices is increased, it is necessary to further improve the switching speed and voltage resistance of IGBTs.

SUMMARY OF THE INVENTION

In light of the above, an IGBT formed by a high electron mobility transistor and a heterojunction bipolar transistor is provided in the present invention.

According to a preferred embodiment of the present invention, an IGBT includes a P-type group III-V nitride compound layer. An N-type group III-V nitride compound layer contacts a side of the P-type group III-V nitride compound layer. An HEMT is disposed on the N-type group III-V nitride compound layer. The HEMT includes a first group III-V nitride compound layer disposed on the N-type group III-V nitride compound layer. A second group III-V nitride compound layer is disposed on the first group III-V nitride compound layer. A source is embedded within the second group III-V nitride compound layer and the first group III-V nitride compound layer, wherein the source includes an N-type group III-V nitride compound body and a metal contact. A drain contacts another side of the P-type group III-V nitride compound layer. A gate is disposed on the second group III-V nitride compound layer.

According to another preferred embodiment of the present invention, an insulated gate bipolar transistor includes a P-type group III-V nitride compound layer. An N-type group III-V nitride compound layer contacts a side of the P-type group III-V nitride compound layer. An HEMT is disposed on the N-type group III-V nitride compound layer, wherein the HEMT includes a first group III-V nitride compound layer disposed on the N-type group III-V nitride compound layer. A second group III-V nitride compound layer is disposed on the first group III-V nitride compound layer. A source is embedded within the second group III-V nitride compound layer and the first group III-V nitride compound layer, wherein the source consists of metal. A drain contacts another side of the P-type group III-V nitride compound layer. A gate is disposed on the second group III-V nitride compound layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
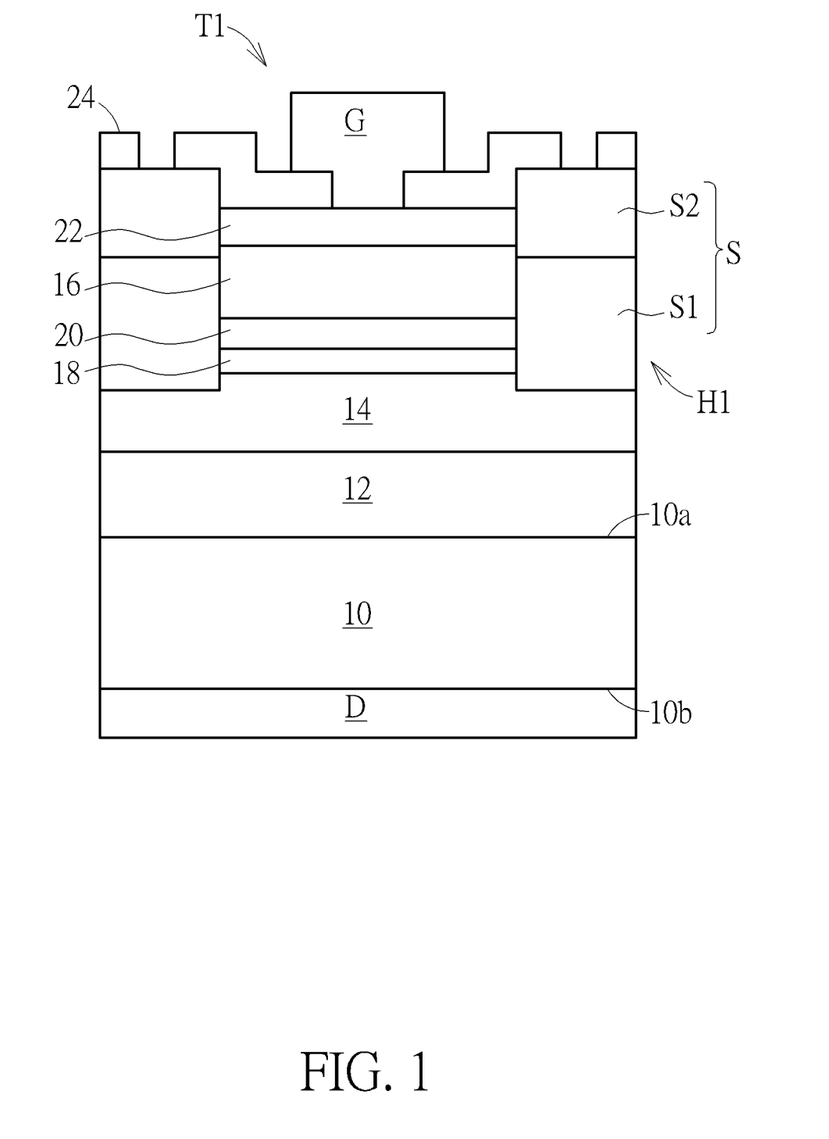
FIG. 1 depicts an insulated gate bipolar transistor according to a first preferred embodiment of the present invention.

FIG. 1 depicts an insulated gate bipolar transistor according to a first preferred embodiment of the present invention.

As shown in FIG. 1, an insulated gate bipolar transistor (IGBT) T1 includes P-type group III-V nitride compound layer 10. An N-type group III-V nitride compound layer 12 contacts a side 10a of the P-type group III-V nitride compound layer 10. A high electron mobility transistor (HEMT) H1 is disposed on the N-type group III-V nitride compound layer 12. The HEMT H1 includes a first group III-V nitride compound layer 14 disposed on the N-type group III-V nitride compound layer 12. A second group III-V nitride compound layer 16 is disposed on the first group III-V nitride compound layer 14. A quantum confinement channel 18 is disposed between the first group III-V nitride compound layer 14 and the second group III-V nitride compound layer 16. The quantum confinement channel 18 contacts the first group III-V nitride compound layer 14. An undoped group III-V nitride compound layer 20 contacts the quantum confinement channel 18. The undoped group III-V nitride compound layer 20 is disposed on the quantum confinement channel 18. A group III-V nitride compound cap layer 22 covers the second group III-V nitride compound layer 16. That is, the first group III-V nitride compound layer 14, the quantum confinement channel 18, the undoped group III-V nitride compound layer 20, the second group III-V nitride compound layer 16 and the group III-V nitride compound cap layer 22 are disposed from bottom to top. Two dimensional gas is generated within the quantum confinement channel 18.

A source S is embedded within the second group III-V nitride compound layer 16 and the first group III-V nitride compound layer 14. In details, the source S penetrates the group III-V nitride compound cap layer 22, the second group III-V nitride compound layer 16, the undoped group III-V nitride compound layer 20, the quantum confinement channel 18 and contacts the first group III-V nitride compound layer 14. Moreover, the source S includes an N-type group III-V nitride compound body S1 and a metal contact S2. A drain D contacts another side 10b of the P-type group III-V nitride compound layer 10. That is, the drain D and the source S are respectively disposed at two opposite sides of the P-type group III-V nitride compound layer 10. A gate G is disposed on the second group III-V nitride compound layer 16. The gate G contacts the group III-V nitride compound cap layer 22. A protective layer 24 covers the group III-V nitride compound cap layer 22 and the source S.

The P-type group III-V nitride compound layer 10 includes $In_mGa_{1-m}N$, and $m \leq 1$. The N-type group III-V nitride compound layer 12 includes $In_nGa_{1-n}N$, and $n \leq 1$. The first group III-V nitride compound layer 14 includes GaN.

The second group III-V nitride compound layer 16 includes $Al_yGa_{1-y}N$, and $y<1$. According to a preferred embodiment of the present invention, y of the $AlGa_{1-y}N$ of the second group III-V nitride compound layer 16 decreases from bottom to top. That is, y is greater in the second group III-V nitride compound layer 16 nearer to the undoped group III-V nitride compound layer 20. For example, y of the second group III-V nitride compound layer 16 contacts the undoped group III-V nitride compound layer 20 is 0.9. Therefore, the second group III-V nitride compound layer 16 is $Al_{0.9}Ga_{0.1}N$. On the other hand, y of the second group III-V nitride compound layer 16 contacts the group III-V nitride compound cap layer 22 is 0.25. Therefore, the second group III-V nitride compound layer 16 is $Al_{0.25}Ga_{0.75}N$.

The quantum confinement channel 18 includes undoped $In_qGa_{1-q}N$, and $q\leq 1$. The undoped group III-V nitride compound layer 20 is preferably AlN. The group III-V nitride compound cap layer 22 is preferably GaN. The N-type group III-V nitride compound body S1 of the source S is preferably $In_rGa_{1-r}N$, and $r\leq 1$. Furthermore, dopants in the N-type group III-V nitride compound layer 12 includes group IV elements. Dopants within the P-type group III-V nitride compound layer 10 includes group II elements such as Mg, Ca, Sr. In this embodiment, the P-type dopants are preferably Mg. N-type dopants in the second group III-V nitride compound layer 16 includes group IV elements such as C, Si or Ge. In this embodiment, the N-type dopants are preferably Si.

The metal contact S2 of the source S, the drain D and the gate G may respectively include metal-containing materials or other doped semiconductive materials. The metal-containing materials may be Au, W, Co, Ni, Ti, Mo, Cu, Al, Ta, Pd or chemical compounds, composite layers or alloys of the Au, W, Co, Ni, Ti, Mo, Cu, Al, Ta or Pd.

Moreover, the source S serves as the source S of the HEMT H1 and the emitter of the IGBT T1. The drain D serves as the drain D of the HEMT H1 and the collector of the IGBT T1.

In IGBT T1, the N-type group III-V nitride compound body S1 of the source S, the first group III-V nitride compound layer 14 and the N-type group III-V nitride compound layer 12 form an NPN transistor. The first group III-V nitride compound layer 14, the N-type group III-V nitride compound layer 12 and the P-type group III-V nitride compound layer 10 form a PNP transistor. In the first preferred embodiment, the NPN transistor and the PNP transistor are both heterojunction. In is note-worthy that P-type dopants within the first group III-V nitride compound layer 14 is used to adjust the threshold voltage of the HEMT H1, and also to adjust the voltage between the base and the emitter of the NPN transistor. In general, the concentration of the P-type dopants in the first group III-V nitride compound layer 14 is controlled to a certain value to make the HEMT H1 become a normally-off transistor. In this embodiment, the HEMT H1 is preferably a normally-off transistor.

Figure 2:
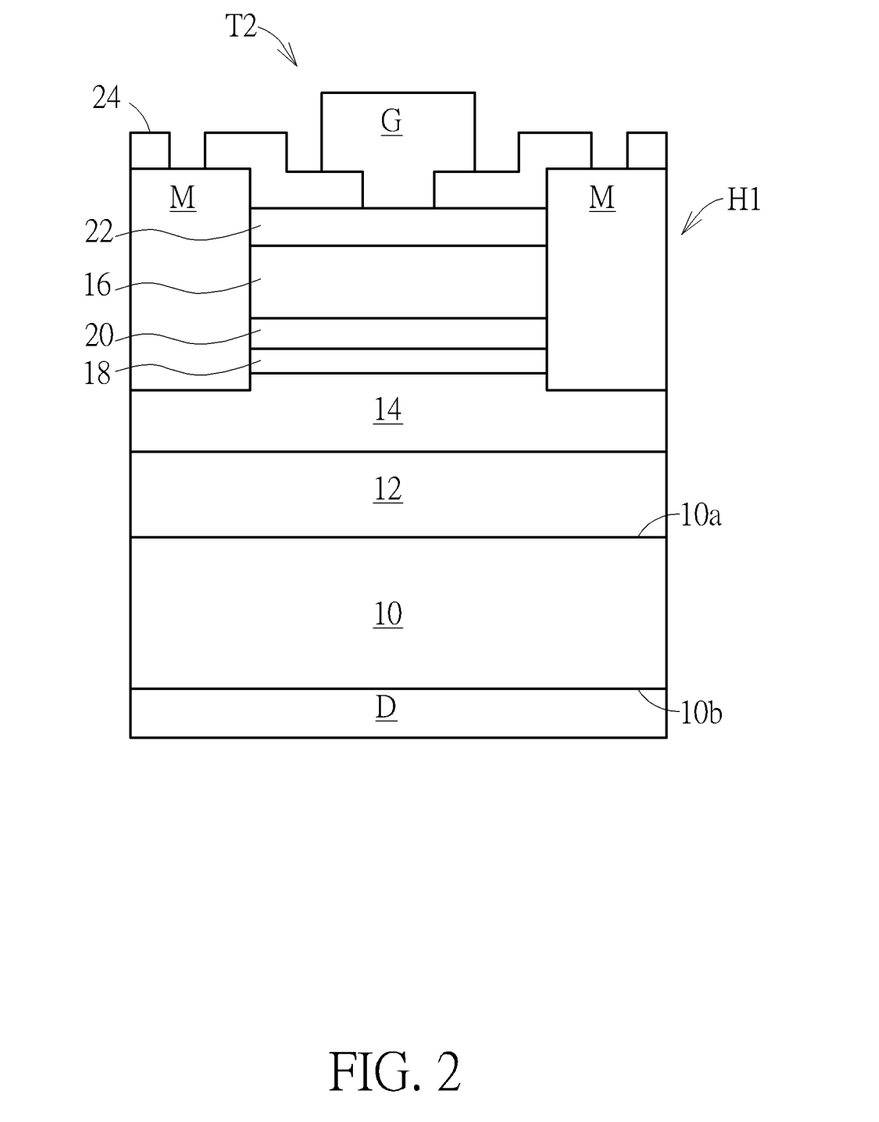
FIG. 2 depicts an insulated gate bipolar transistor according to a second preferred embodiment of the present invention.

FIG. 2 depicts an insulated gate bipolar transistor according to a second preferred embodiment of the present invention, wherein elements which are substantially the same as those in the first preferred embodiment are denoted by the same reference numerals; an accompanying explanation is therefore omitted.

Please refer to FIG. 1 and FIG. 2. The difference between the IGBT T2 in the second preferred embodiment and the IGBT T1 in the first preferred embodiment is that the source M of the IGBT T2 is entirely made of metal. In other words, the source M of the IGBT T2 only consists of metal. Other elements in the IGBT T2 are the same as those in the IGBT T1. The source M may include Au, W, Co, Ni, Ti, Mo, Cu, Al, Ta, Pd or chemical compounds, composite layers or alloys of the Au, W, Co, Ni, Ti, Mo, Cu, Al, Ta or Pd.

Figure 3:
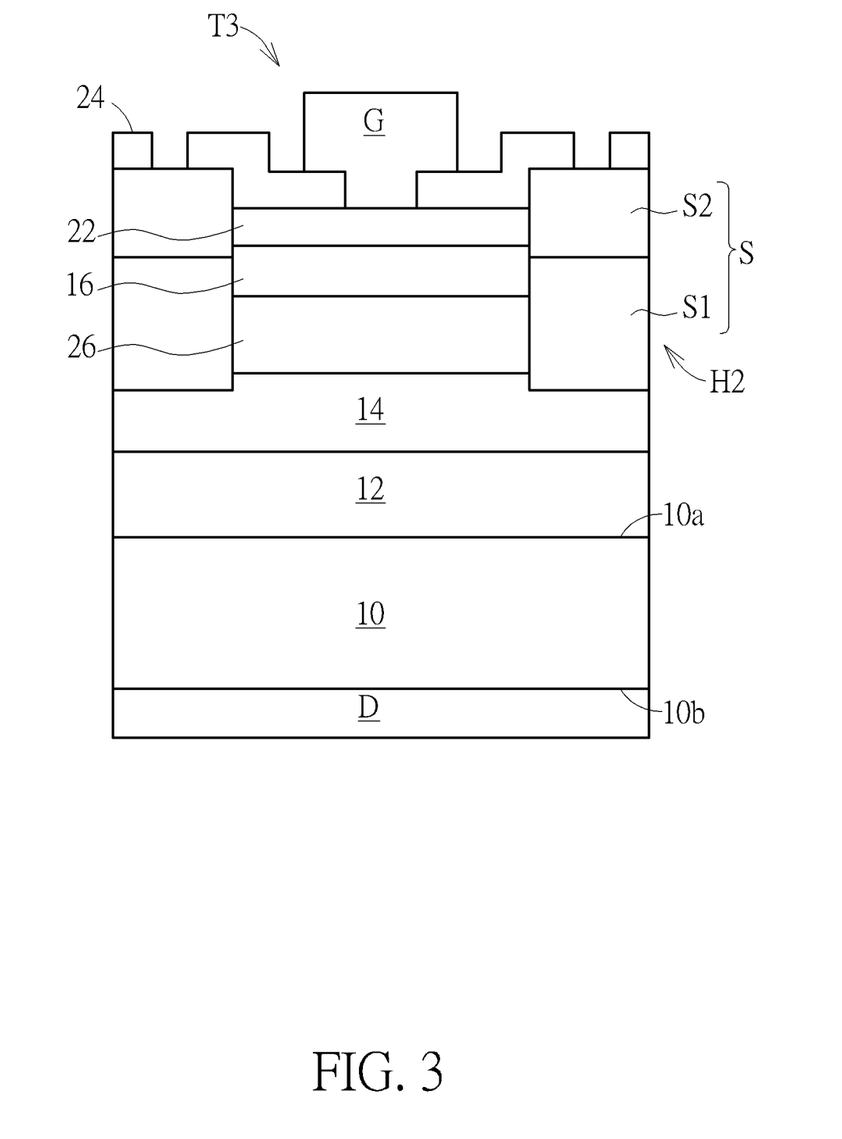
FIG. 3 depicts an insulated gate bipolar transistor according to a third preferred embodiment of the present invention.

FIG. 3 depicts an insulated gate bipolar transistor according to a third preferred embodiment of the present invention, wherein elements which are substantially the same as those in the first preferred embodiment are denoted by the same reference numerals; an accompanying explanation is therefore omitted.

The difference between the IGBT T3 in the third preferred embodiment and the IGBT T1 in the first preferred embodiment is the structure of the HEMT. As shown in FIG. 3, the HEMT H2 includes a first group III-V nitride compound layer 14. A gallium nitride layer 26 is disposed on the first group III-V nitride compound layer 14. A second group III-V nitride compound layer 16 is disposed on the gallium nitride layer 26. A group III-V nitride compound cap layer 22 covers the second group III-V nitride compound layer 16. That is, the first group III-V nitride compound layer 14, the gallium nitride layer 26, the second group III-V nitride compound layer 16 and the group III-V nitride compound cap layer 22 are disposed from bottom to top. The first group III-V nitride compound layer 14 contacts the gallium nitride layer 26. The gallium nitride layer 26 contacts the second group III-V nitride compound layer 16. The second group III-V nitride compound layer 16 contacts the group III-V nitride compound cap layer 22. Two dimensional gas is generated within the gallium nitride layer 26. A source S is embedded within the group III-V nitride compound cap layer 22, the second group III-V nitride compound layer 16, the gallium nitride layer 26 and the first group III-V nitride compound layer 14. The source S is the same as that in the first preferred embodiment, which is made by the N-type group III-V nitride compound body S1 and the metal contact S2. Other elements are substantially the same as those in the first preferred embodiment.

Figure 4:
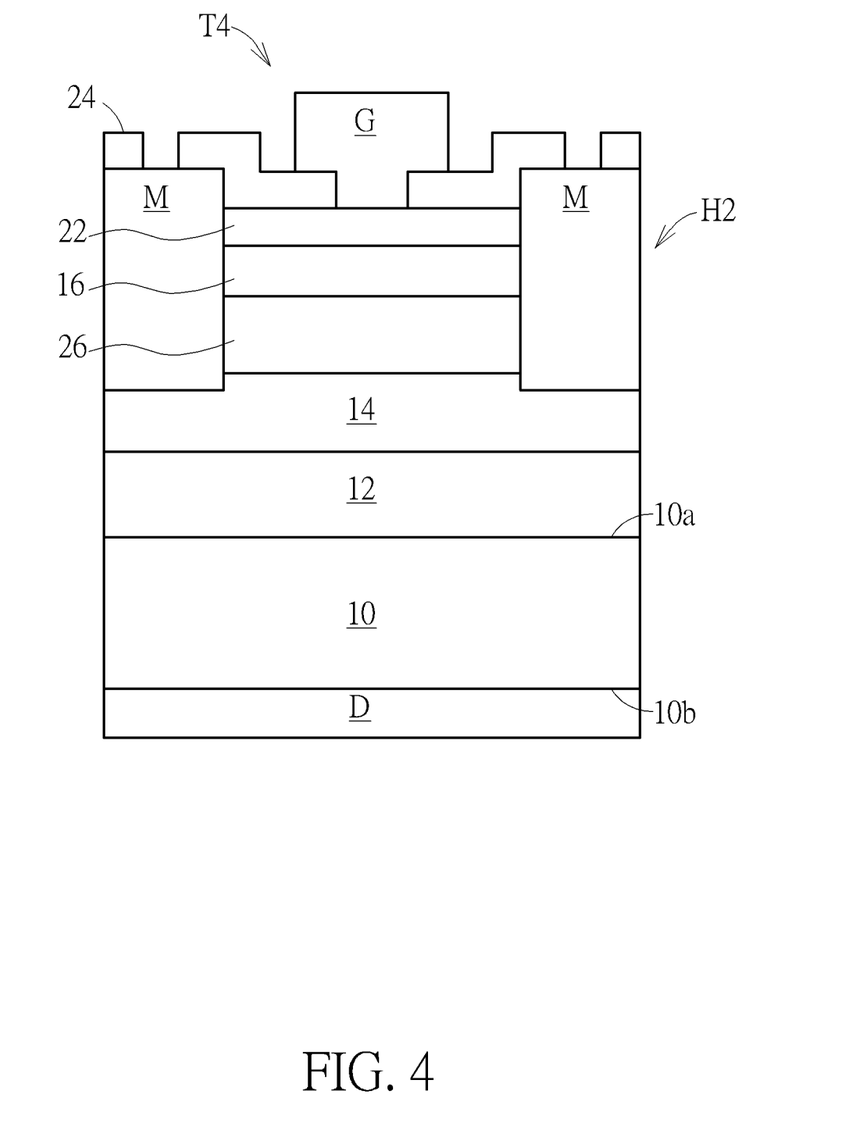
FIG. 4 depicts an insulated gate bipolar transistor according to a fourth preferred embodiment of the present invention.

FIG. 4 depicts an insulated gate bipolar transistor according to a fourth preferred embodiment of the present invention, wherein elements which are substantially the same as those in the third preferred embodiment are denoted by the same reference numerals; an accompanying explanation is therefore omitted.

Please refer to FIG. 3 and FIG. 4. The difference between the IGBT T3 in the third preferred embodiment and the IGBT T4 in the fourth preferred embodiment is that the source M of the IGBT T4 is entirely made of metal. In other words, the source M of the IGBT T4 only consists of metal. Other elements in the IGBT T4 are the same as those in the IGBT T3. The source M may include Au, W, Co, Ni, Ti, Mo, Cu, Al, Ta, Pd or chemical compounds, composite layers or alloys of the Au, W, Co, Ni, Ti, Mo, Cu, Al, Ta or Pd.

Figure 5:
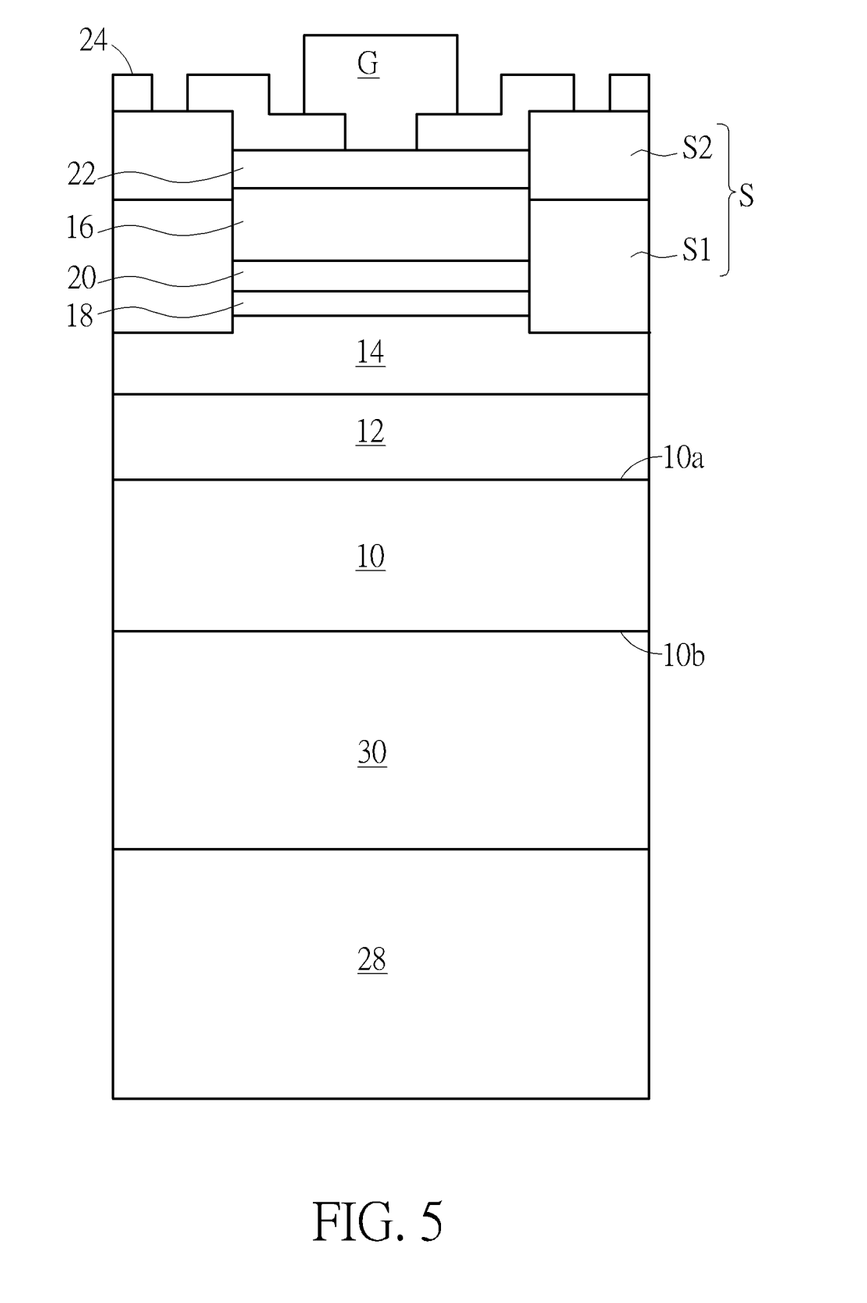
FIG. 5 depicts a fabricating method of an IGBT in the first preferred embodiment.

FIG. 5 and FIG. 1 depict a fabricating method of an IGBT in the first preferred embodiment, wherein elements which are substantially the same as those in the first preferred embodiment are denoted by the same reference numerals; an accompanying explanation is therefore omitted.

As shown in FIG. 5, the steps of forming the IGBT include providing the substrate 28. Then, a buffering layer 30 is formed to cover the substrate 28. Later, a P-type group III-V nitride compound layer 10 is formed. Next, an N-type group III-V nitride compound layer 12, a first group III-V nitride compound layer 14, a quantum confinement channel 18, an undoped group III-V nitride compound layer 20, a second group III-V nitride compound layer 16 and a group III-V nitride compound cap layer 22 are formed in sequence on a side 10a of the P-type group III-V nitride compound layer 10. After that, a source is formed. Subsequently, a protective layer 24 is formed. Next, a gate G is formed. Later, the substrate 28 and the buffering layer 30 are removed to expose another side 10b of the P-type group III-V nitride compound layer 10. Finally, a drain D is formed on another side 10b of the P-type group III-V nitride compound layer 10. Now, the IGBT T1 is completed.

Moreover, the IGBT T2 of the second preferred embodiment, the IGBT T3 of the third preferred embodiment and the IGBT T4 of the fourth preferred embodiment can be made by the steps mentioned above. By replacing the source in the IGBT T1, the IGBT T2 can be made. By replacing the quantum confinement channel 18 and the undoped group III-V nitride compound layer 20 in IGBT T1 with the gallium nitride layer 26, the IGBT T3 can be made. By replacing the source in the IGBT T3 with metal, the IGBT T4 can be made.

The IGBT of the present invention uses an HEMT to accelerate the speed of switching on and off and also increase the breakdown voltage. Moreover, the NPN transistor and the PNP transistor are utilized to increase current density of the IGBT. Therefore, the IGBT of the present invention has low on-resistance, high current tolerance, high voltage tolerance and high switching speed. Comparing to the conventional IGBT which includes MOSFET, the on-resistance of the IGBT in the present invention is only one-twentieth to one-tenth of the on-resistance of the conventional IGBT. In addition, the IGBT of the present invention is vertical which can save more area comparing the lateral transistors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An insulated gate bipolar transistor, comprising:
   a P-type group III-V nitride compound layer;
   an N-type group III-V nitride compound layer contacting a side of the P-type group III-V nitride compound layer;
   a high electron mobility transistor (HEMT) disposed on the N-type group III-V nitride compound layer, wherein the HEMT comprises:
      a first group III-V nitride compound layer disposed on the N-type group III-V nitride compound layer;
      a second group III-V nitride compound layer disposed on the first group III-V nitride compound layer;
      a source embedded within the second group III-V nitride compound layer and the first group III-V nitride compound layer, wherein the source comprises an N-type group III-V nitride compound body and a metal contact;
   a drain contacting another side of the P-type group III-V nitride compound layer; and
   a gate disposed on the second group III-V nitride compound layer.

2. The insulated gate bipolar transistor of claim 1, wherein the P-type group III-V nitride compound layer comprises $In_mGa_{1-m}N$, and $m \leq 1$.

3. The insulated gate bipolar transistor of claim 1, wherein the N-type group III-V nitride compound layer comprises $In_nGa_{1-n}N$, and $n \leq 1$.

4. The insulated gate bipolar transistor of claim 1, further comprising a gallium nitride layer disposed on the first group III-V nitride compound layer, wherein the first group III-V nitride compound layer comprises GaN, and the second group III-V nitride compound layer comprises $Al_xGa_{1-x}N$, and $x<1$, and wherein two dimensional gas is generated within the gallium nitride layer.

5. The insulated gate bipolar transistor of claim 1, wherein the second group III-V nitride compound layer comprises N-type dopants.

6. The insulated gate bipolar transistor of claim 1, wherein the first group III-V nitride compound layer comprises P-type GaN, and wherein the second group III-V nitride compound layer comprises N-type $Al_yGa_{1-y}N$, and $y<1$.

7. The insulated gate bipolar transistor of claim 6, further comprising:
   a quantum confinement channel disposed between the first group III-V nitride compound layer and the second group III-V nitride compound layer, wherein the quantum confinement channel comprises undoped $In_qGa_{1-q}N$, and $q \leq 1$;
   an undoped group III-V nitride compound layer contacting the quantum confinement channel and is disposed on the quantum confinement channel; and
   a group III-V nitride compound cap layer covering the second group III-V nitride compound layer.

8. The insulated gate bipolar transistor of claim 1, wherein dopants within the N-type group III-V nitride compound layer comprises group IV elements, and dopants within the P-type group III-V nitride compound layer comprises group II elements.

9. An insulated gate bipolar transistor, comprising:
   a P-type group III-V nitride compound layer;
   an N-type group III-V nitride compound layer contacting a side of the P-type group III-V nitride compound layer;
   a high electron mobility transistor (HEMT) disposed on the N-type group III-V nitride compound layer, wherein the HEMT comprises:
      a first group III-V nitride compound layer disposed on the N-type group III-V nitride compound layer;
      a second group III-V nitride compound layer disposed on the first group III-V nitride compound layer;
      a source embedded within the second group III-V nitride compound layer and the first group III-V nitride compound layer, wherein the source consists of metal;
   a drain contacting another side of the P-type group III-V nitride compound layer; and
   a gate disposed on the second group III-V nitride compound layer.

10. The insulated gate bipolar transistor of claim 9, wherein the P-type group III-V nitride compound layer comprises $In_mGa_{1-m}N$, and $m \leq 1$.

11. The insulated gate bipolar transistor of claim 9, wherein the N-type group III-V nitride compound layer comprises $In_nGa_{1-n}N$, and $n \leq 1$.

12. The insulated gate bipolar transistor of claim 9, further comprising a gallium nitride layer disposed on the first group III-V nitride compound layer, wherein the first group III-V nitride compound layer comprises GaN, and the second group III-V nitride compound layer comprises $Al_xGa_{1-x}N$, and $x<1$, and wherein two dimensional gas is generated within the gallium nitride layer.

13. The insulated gate bipolar transistor of claim 9, wherein the second group III-V nitride compound layer comprises N-type dopants.

14. The insulated gate bipolar transistor of claim 9, wherein the first group III-V nitride compound layer comprises P-type GaN, and wherein the second group III-V nitride compound layer comprises N-type $Al_yGa_{1-y}N$, and $y<1$.

15. The insulated gate bipolar transistor of claim 14, further comprising:
- a quantum confinement channel disposed between the first group III-V nitride compound layer and the second group III-V nitride compound layer, wherein the quantum confinement channel comprises undoped $In_qGa_{1-q}N$, and $q \leq 1$;
- a undoped group III-V nitride compound layer contacting the quantum confinement channel and is disposed on the quantum confinement channel; and
- a group III-V nitride compound cap layer covering the second group III-V nitride compound layer.

16. The insulated gate bipolar transistor of claim 9, wherein dopants within the N-type group III-V nitride compound layer comprises group IV elements, and dopants within the P-type group III-V nitride compound layer comprises group II elements.

* * * * *